(12) United States Patent
Amano et al.

(10) Patent No.: US 10,976,354 B2
(45) Date of Patent: Apr. 13, 2021

(54) CURRENT SENSOR

(71) Applicant: TAMURA CORPORATION, Tokyo (JP)

(72) Inventors: Kasuga Amano, Saitama (JP); Yusuke Okayama, Saitama (JP)

(73) Assignee: TAMURA CORPORATION, Tokyo (JP)

( * ) Notice: Subject to any disclaimer, the term of this patent is extended or adjusted under 35 U.S.C. 154(b) by 140 days.

(21) Appl. No.: 16/155,383

(22) Filed: Oct. 9, 2018

(65) Prior Publication Data

US 2019/0107564 A1    Apr. 11, 2019

(30) Foreign Application Priority Data

Oct. 10, 2017  (JP) .............................. JP2017-196628

(51) Int. Cl.
*G01R 15/20* (2006.01)
*G01R 15/18* (2006.01)
(Continued)

(52) U.S. Cl.
CPC ............ *G01R 15/207* (2013.01); *G01R 1/18* (2013.01); *G01R 15/185* (2013.01);
(Continued)

(58) Field of Classification Search
CPC .......... G01R 1/18; G01R 1/22; G01R 15/202; G01R 15/207; G01R 15/185;
(Continued)

(56) References Cited

U.S. PATENT DOCUMENTS 6,507,261 B1 *  1/2003  Haga ..................... H01F 27/306
                                                                336/192
8,618,796 B2   12/2013  Teppan et al.
(Continued)

FOREIGN PATENT DOCUMENTS

JP       2013-64608        4/2013
JP       2013179233        9/2013
(Continued)

OTHER PUBLICATIONS

Official Communication issued in Japan Patent Office (JPO) Patent Application No. 2017-196628, dated Jul. 16, 2019, with English translation thereof.
(Continued)

*Primary Examiner* — Giovanni Astacio-Oquendo
*Assistant Examiner* — Dustin R Dickinson
(74) *Attorney, Agent, or Firm* — Greenblum & Bernstein, P.L.C.

(57) ABSTRACT

A current sensor includes core components that form a magnetic circuit and form a space where to dispose a probe coil on the magnetic circuit; and a clip that press-joins the core components with each other. Since magnetic reluctance decreases at a portion where the core components are press-joined by the clip, an amount of magnetic flux of an external magnetic field passing through this portion increases, and accordingly, an amount of magnetic flux interlinked with the probe coil decreases. This improves the immunity of the current sensor to an external magnetic field.

13 Claims, 14 Drawing Sheets

(51) Int. Cl.
*G01R 1/18* (2006.01)
*G01R 19/00* (2006.01)
*G01R 33/04* (2006.01)

(52) U.S. Cl.
CPC ....... *G01R 15/186* (2013.01); *G01R 19/0092* (2013.01); *G01R 33/04* (2013.01); *G01R 15/202* (2013.01)

(58) Field of Classification Search
CPC G01R 15/186; G01R 15/183; G01R 19/0092; G01R 33/04; H01F 38/30; H01F 38/305
See application file for complete search history.

(56) References Cited

U.S. PATENT DOCUMENTS

| | | | | |
|---|---|---|---|---|
| 2009/0115403 | A1* | 5/2009 | Bernklau | G01R 15/186 324/127 |
| 2010/0301852 | A1* | 12/2010 | Teppan | G01R 15/18 324/253 |
| 2011/0242720 | A1* | 10/2011 | Annis | H01F 38/30 361/115 |
| 2014/0266180 | A1 | 9/2014 | Ausserlechner | |
| 2016/0231362 | A1* | 8/2016 | Nanshan | H01F 38/30 |
| 2016/0327593 | A1* | 11/2016 | Labbe | G01R 31/364 |
| 2017/0010310 | A1* | 1/2017 | Morel | H01R 13/6683 |

FOREIGN PATENT DOCUMENTS

| | | |
|---|---|---|
| JP | 2014-70914 | 4/2014 |
| JP | 5579757 B2 | 8/2014 |
| JP | 5894736 B2 | 3/2016 |
| JP | 5926911 B2 | 5/2016 |
| WO | 2013/038759 | 3/2013 |

OTHER PUBLICATIONS

Official Communication issued in European Patent Office (EPO) Patent Application No. 18198562.3, dated Mar. 29, 2019.
Official Communication issued in Japan Patent Office (JPO) Patent Application No. 2017-196628, dated Mar. 3, 2020, with an English translation thereof.

* cited by examiner

CURRENT SENSOR

BACKGROUND OF THE INVENTION

The present invention relates to a current sensor, and in particular, to a current sensor including a magnetic core composed of a combination of a plurality of parts.

Current sensors including a magnetic core composed of at least two core components are well-known. In such current sensors, the core components are combined with each other, thereby forming a substantially closed magnetic circuit. Further, the core components are each formed of a folded thin plate of a soft magnetic material and on an inner side of the core components, a cavity in which a probe coil is housed is formed. The current sensors including the magnetic core having such a structure are apt to be influenced by an external magnetic field at the time of sensing.

BRIEF SUMMARY OF THE INVENTION

One embodiment of the invention disclosed and claimed herein includes a current sensor. The current sensor includes: a magnetic circuit that is to be formed around a primary conductor in which a primary current being a sensing target flows; a probe coil disposed on the magnetic circuit; a secondary winding that generates, in the magnetic circuit, a magnetic field in a direction opposite to a direction of a magnetic field generated by the flow of the primary current; a sensing circuit that outputs a sensing signal according to the primary current based on a secondary current of the secondary winding as required to eliminate a current output from the probe coil; a plurality of core components that have magnetism, and in a combined state, form the magnetic circuit by partial portions of the core components being in contact with each other, the core components having other portions that form an air gap where to dispose the probe coil on the magnetic circuit and are in non-contact with each other; and a clip that generates force press-joining the plurality of core components with each other, at the portions where the core components are in contact with each other.

Further scope of applicability of the present invention will become apparent from the detailed description given hereinafter. However, it should be noted that the detailed description and specific example, while indicating is preferred embodiment of the invention, are given by way of illustration only, since various changes and modifications within the spirit and scope of the invention will become apparent to those skilled in the art from this detailed description.

BRIEF DESCRIPTION OF THE SEVERAL VIEWS OF THE DRAWINGS

The present invention is described in detail hereinbelow with reference to the accompanying drawing figures, wherein.

DETAILED DESCRIPTION OF THE INVENTION

Hereinafter, embodiments of the present invention will be described with reference to the drawings. In the following embodiments, a flux-gate type current sensor is taken as an example of a current sensor, but the present invention is not limited to this.

Figure 1:
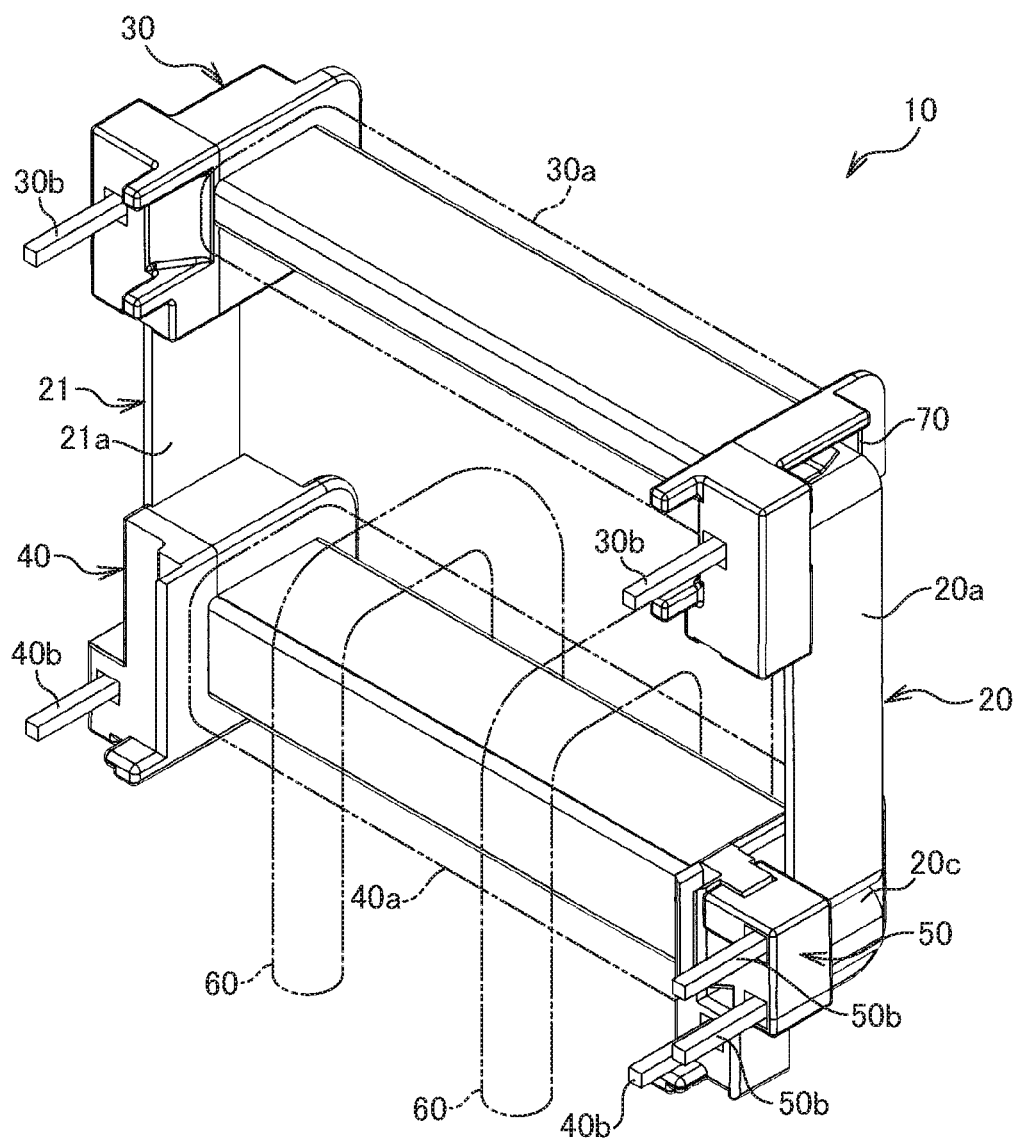
FIGS. 1 and 2 are perspective views schematically illustrating the structure of a current sensor of the first embodiment.
Figure 2:
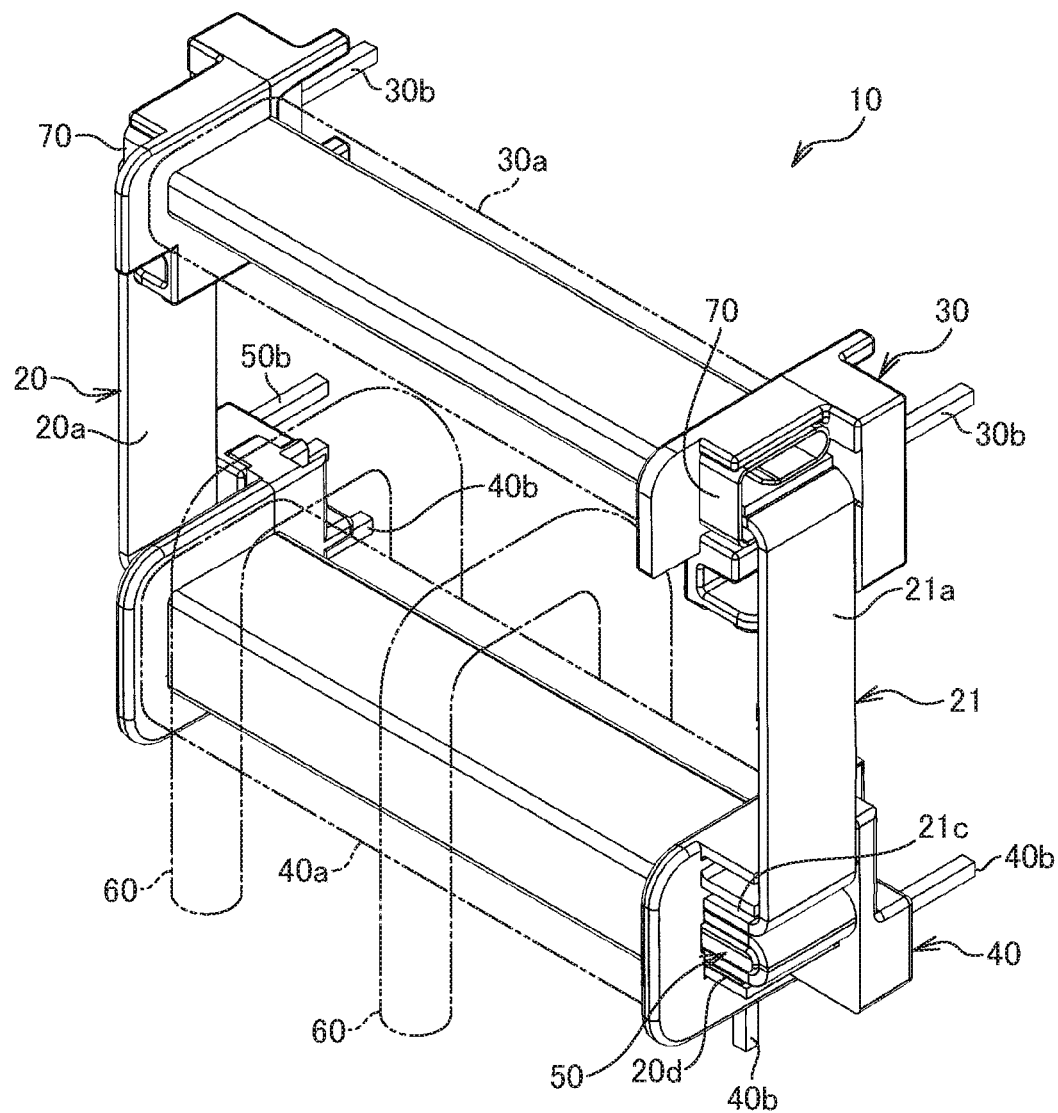

FIGS. 1 and 2 are perspective views schematically illustrating the structure of a current sensor 10 of the first embodiment. When the current sensor 10 is commercialized, its constituent components illustrated in FIGS. 1 and 2 are usually housed in, for example, a resin casing, which is not illustrated. Further, the basic appearance of this casing is, for example, a rectangular parallelepiped.

The current sensor 10 includes a plurality of core components 20, 21. These core components 20, 21 in a combined state form one magnetic circuit. In this embodiment, the two core components 20, 21 form the magnetic circuit closed in a rectangular shape. Two primary conductors 60 are disposed to penetrate through the inside of the magnetic circuit, and when the current sensor 10 is in use, a primary current which is a sensing target flows through the two primary conductors 60. In the state illustrated in FIGS. 1 and 2, the magnetic circuit is upright and the two primary conductors 60 penetrate through the inside of the magnetic circuit in a horizontal direction. Further, these primary conductors 60 are bent in one direction (downward direction in FIGS. 1 and 2) at both sides of their portions penetrating through the magnetic circuit, and their whole shape is an inverted U-shape with their both end portions extending in the same direction. Note that the two primary conductors 60 are disposed inside the magnetic circuit while supported in the not-illustrated casing. The number of the primary conductors 60 is not limited to two, but may be one or may be three or more. Further, the shape of the primary conductors 60 is not limited to the inverted U-shape, and their bending direction may be opposite to the direction illustrated in FIGS. 1 and 2.

The current sensor 10 includes two bobbin units 30, 40. In the bobbin units 30, 40, core components 20, 21 are housed, and on outer sides of the bobbin units 30, 40, secondary windings 30a, 40a are held. In the state illustrated in FIGS. 1 and 2, the bobbin unit 30 is located on an upper side and the other bobbin unit 40 is located on a lower side. In addition to the aforesaid secondary windings 30a, 40a, the bobbin units 30, 40 have a plurality of lead terminals 30b, 40b. Through these lead terminals 30b, 40b, the current sensor 10 can be mounted on a circuit board or can be connected to other electric devices. Incidentally, in addition to the bobbin units 30, 40, a not-illustrated bobbin unit may be further disposed.

The current sensor 10 includes a probe coil unit 50. The probe coil unit 50 is housed inside the lower bobbin unit 40. In more detail, the two core components 20, 21 form a housing part (not illustrated in FIGS. 1 and 2) inside the bobbin unit 40, and the probe coil unit 50 is disposed in the housing part. Further, the probe coil unit 50 has a probe coil (field probe) not illustrated here. In the current sensor 10 in an assembled state, the probe coil is disposed on the magnetic circuit (in an air gap). The probe coil unit 50 also has a plurality of lead terminals 50b and the connection to the probe coil is done through these lead terminals 50b.

The probe coil unit 50 has a circuit board (not illustrated), and a signal output IC (not illustrated in FIGS. 1 and 2) is mounted on this circuit board. When a magnetic field is generated in the periphery (magnetic circuit) of the primary conductors 60 due to the flow of the primary current during the use of the current sensor 10, the signal output IC outputs a secondary current (feedback current) to the secondary windings 30a, 40a to generate a magnetic field in the reverse direction, thereby performing control to eliminate an output current of the probe coil. At this time, the signal output IC converts the secondary current into a voltage signal by a shunt resistor and outputs it as a sensing signal according to the primary current.

Figure 3A:
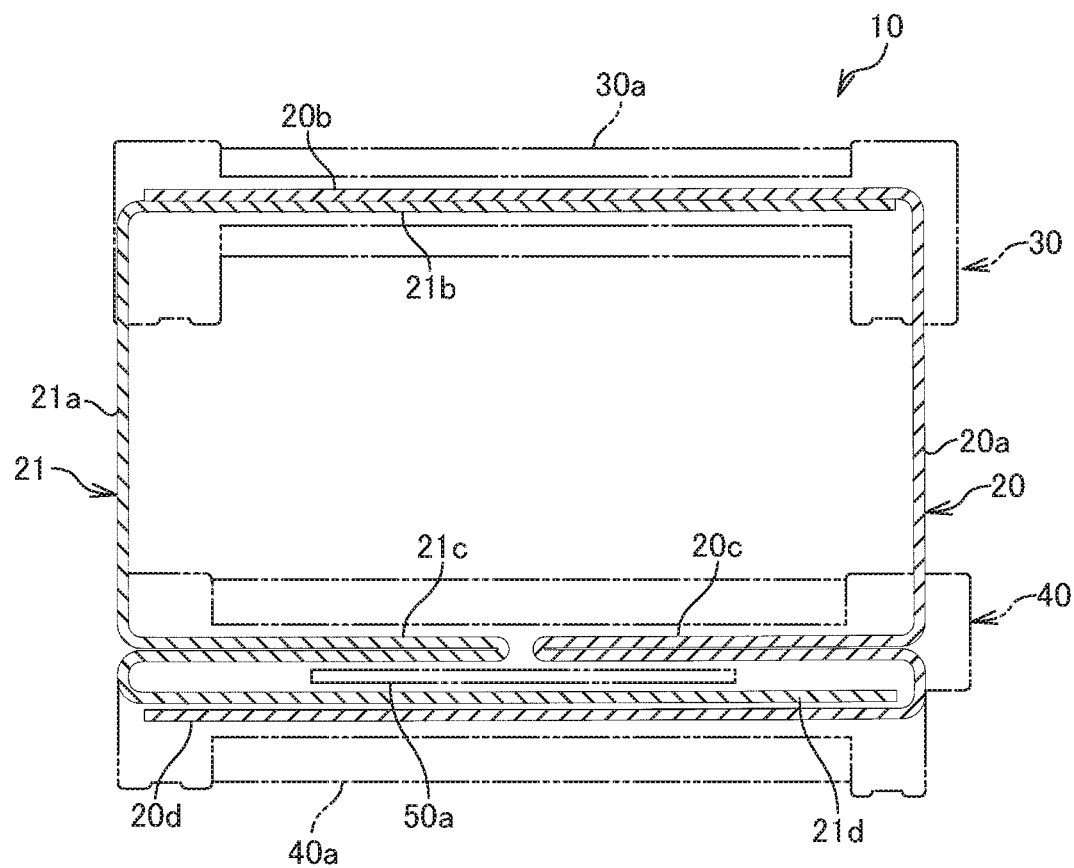
FIG. 3A illustrates the structure of core components in more detail.

FIG. 3A illustrates the structure of the core components 20, 21 in more detail. The core components 20, 21 are each formed through bending of a thin plate of a soft magnetic material such as permalloy, and the two core components 20, 21 are set to face each other in the longitudinal direction across the center of the rectangular magnetic circuit to be combined. However, the shapes of the core components 20, 21 are not symmetric with each other. Specifically, the core components 20, 21 have short-side portions 20a, 21a, long-side portions 20b, 21b, inner wall portions 20c, 21c, and outer wall portions 20d, 21d, and at first glance, they appear symmetric in the combined direction. However, the long-side portions 20b, 21b are in a contact relation when overlapping with each other, while the outer wall portions 20d, 21d are in a non-contact relation with a gap therebetween, though they are in proximity to each other in an overlapping direction. The other short-side portions 20a, 21a and inner wall portions 20c, 21c are substantially symmetric with each other in terms of the combined direction. Incidentally, in the gap between the outer wall portions 20d, 21d, a magnetic material sheet or an adhesive sheet higher in magnetic permeability than the core components 20, 21 may be inserted.

In the state where the core components 20, 21 are combined, the housing part (housing space) is formed between the inner wall portions 20c, 21c and the outer wall portions 20d, 21d, and the probe coil (field probe) 50a is housed in this housing part. As illustrated in FIG. 3A, the probe coil 50a is disposed on the magnetic circuit (in the air gap, space).

Figure 3B:
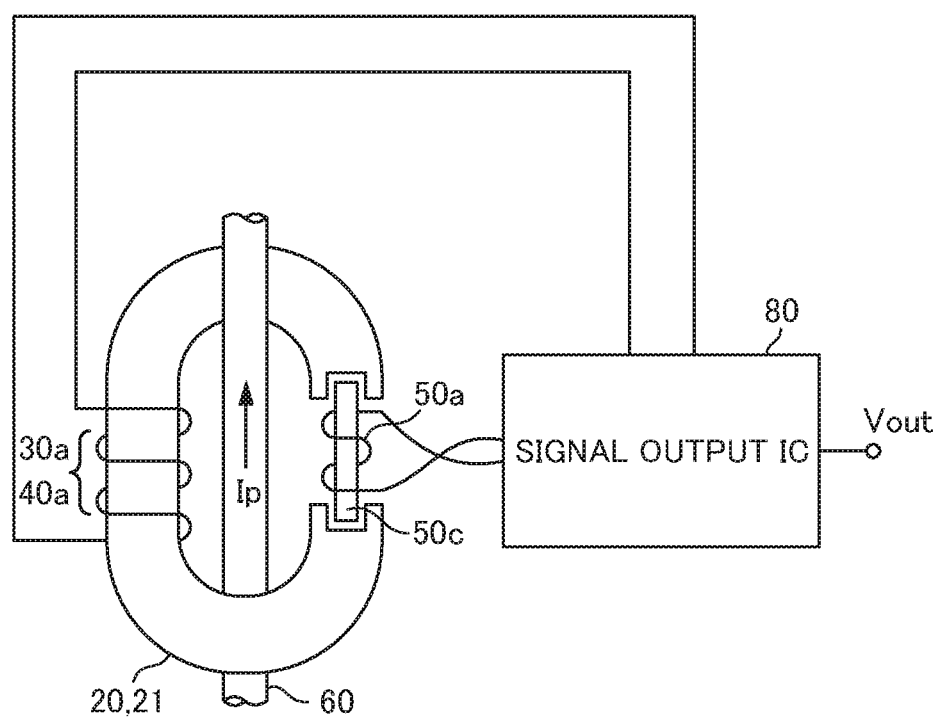
FIG. 3B schematically illustrates the operation of the current sensor.

FIG. 3B schematically illustrates the operation of the current sensor 10. The probe coil 50a is connected to the aforesaid signal output IC 80 and is wound around a flux-gate core 50c. Further, the signal output IC 80 has a not-illustrated pulse power supply circuit therein. When a high-frequency rectangular current is supplied to the probe coil 50a from the pulse power supply circuit, a magnetic flux density in the flux-gate core 50c periodically saturates. Accordingly, when a magnetic field is generated in the magnetic circuit (core components 20, 21) due to the primary current Ip flowing in the primary conductors 60, a waveform of a voltage applied to the probe coil 50a is distorted due to the magnetic field generated in the magnetic circuit.

The signal output IC 80 has a not-illustrated probe interface therein, and the probe interface converts the voltage across the probe coil 50a into a PWM signal. The PWM signal output from the probe interface becomes a pulse signal with a predetermined duty ratio (for example, 50%) in a state where a magnetic field is not generated in the flux-gate core 50c (in a state where the primary current Ip is not flowing). The duty ratio of the PWM signal varies according to the strength of the magnetic field applied to the flux-gate core 50c.

Further, the signal output IC 80 has therein a filter circuit and a driver circuit, which are not illustrated. The filter circuit analog-converts the PWM signal output from the probe interface into an output voltage and outputs it to the driver circuit. The secondary windings 30a, 40a are connected to the driver circuit. The driver circuit senses a difference between the output voltage from the filter circuit and a predetermined reference voltage Vref, and outputs the secondary current whose magnitude depends on the difference, to the secondary windings 30a, 40a. When the secondary current is output, a feedback magnetic field is generated, and the magnetic field in the magnetic circuit induced by the primary current Ip flowing through the primary conductors 60 is canceled out. The signal output IC 80 performs the control to eliminate the output current of the probe coil 50a in this manner.

The current sensor 10 converts the secondary current measured by the shunt resistor into an output voltage Vout to extract it, thereby outputting the sensing signal according to the primary current Ip. Incidentally, the secondary current flowing through the secondary windings 30a, 40a is periodically changed by the aforesaid negative feedback, but the output voltage Vout has the same waveform as the waveform of the primary current Ip owing to signal processing in the signal output IC 80 and hence has a value substantially correlating with the magnitude of the primary current Ip.

Figure 4:
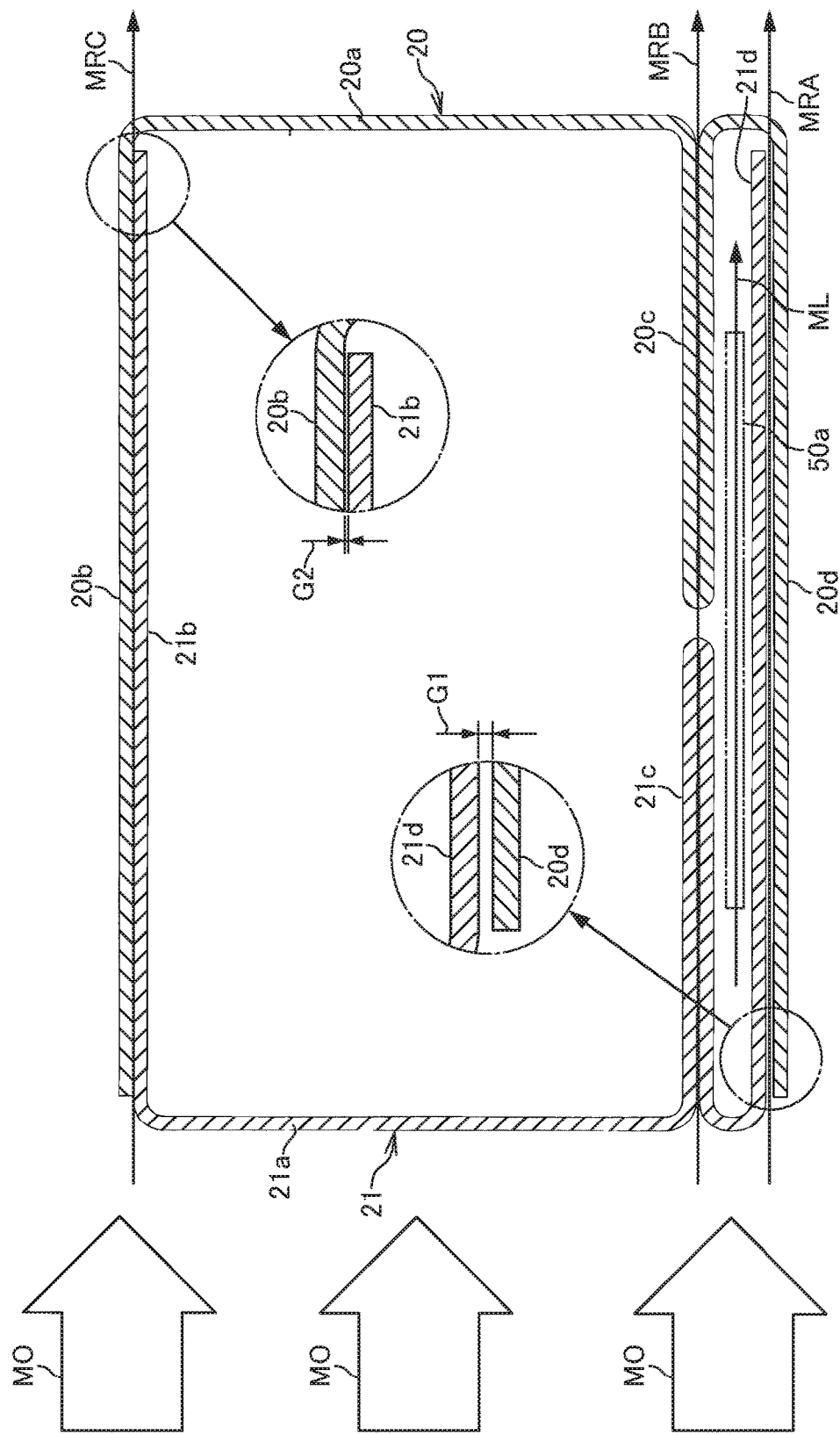
FIG. 4 is a view to explain immunity of the current sensor to an external magnetic field.

FIG. 4 is a view to explain immunity of the current sensor 10 to an external magnetic field. Let us assume a case where an external magnetic field MO comes from one certain direction, for example, from a direction indicated by the white arrows in FIG. 4 to the magnetic circuit formed by the core components 20, 21. The incoming direction of the external magnetic field MO in this case is supposed to be, for example, a direction along surfaces where the core components 20, 21 are in contact with each other, in more detail, surfaces of the long-side portions 20b, 21b overlapping and in contact with each other. The external magnetic field MO corresponds to not only a natural magnetic field such as, for example, geomagnetism but also various kinds of magnetic fields that can be electrically generated in various use environments where the current sensor 10 is placed.

The immunity of the current sensor 10 to the external magnetic field MO is evaluated based on an amount of magnetic flux of the external magnetic field MO interlinked with the probe coil 50a (field probe). This is because, as the amount of the magnetic flux interlinked with the probe coil 50a is larger, an error from an original internal magnetic field (magnetic field generated in the magnetic circuit by the primary current) becomes larger, which accordingly influences sensing accuracy.

When the external magnetic field MO coming from one direction passes through the magnetic circuit formed by the core components 20, 21, roughly three magnetic flux paths MRA, MRB, MRC are supposed to be formed on the magnetic circuit.

(1) The magnetic flux path MRA is formed along a region where the outer wall portions 20d, 21d of the core components 20, 21 face each other with a small gap therebetween.
(2) The magnetic flux path MRB is formed along a region where the inner wall portions 20c, 21c of the core components 20, 21 are in a row with a gap therebetween.
(3) The magnetic flux path MRC is formed along a region (contact surface) where the long-side portions 20b, 21b of the core components 20, 21 overlap and are in contact with each other.

Incidentally, the short-side portions 20a, 21a of the core components 20, 21 are sufficiently apart from each other in the incoming direction of the external magnetic field MO, and thus are not considered as a magnetic flux path here.

As illustrated in the enlarged parts in FIG. 4, on the magnetic flux path MRA, there is a certain gap G1 between the outer wall portions 20d, 21d, and the gap G1 has a size which is pre-intended in designing the current sensor 10. On the other hand, on the magnetic flux path MRC, though there is a gap G2 between the long-side portions 20b, 21b, the presence of the gap G2 is not intended in designing and an ideal size of the gap G2 is 0 mm. However, in an actual product, since the magnetic circuit is formed in the state where the two core components 20, 21 are simply combined, it is technically difficult to completely eliminate the gap G2 from the actual product. This is also true of a case where the long-side portions 20b, 21b are disposed in the bobbin unit 30 in a pressed manner (they are inserted by interference fit). That is, in order to completely eliminate the gap G2, it is necessary to integrate the long-side portions 20b, 21b (join them by melting their materials), and the contact state or adhering state does not lead to the elimination of the gap G2.

Further, the gaps G1, G2 present on the respective magnetic flux paths MRA, MRC are unavoidably subject to change in size depending on various conditions such as a manufacturing condition and a use condition, and it is difficult to technically manage such a change.

With such circumstances in mind, the inventors of the present invention noted the following. Specifically, the magnetic flux passes through a place having a small magnetic reluctance, and therefore, if the sizes of the gaps G1, G2 become larger than average sizes, resulting in an increase in the magnetic reluctance of the magnetic flux paths MRA, MRC, the magnetic flux not capable of passing through the magnetic flux paths MRA, MRC becomes leakage flux to increase an amount of the magnetic flux interlinked with the probe coil 50a, resulting in the deterioration of the immunity of the current sensor 10.

Therefore, in this embodiment, for improving the immunity, the magnetic reluctance of the magnetic flux paths MRA, MRB, MRC is decreased as much as possible to reduce the amount of the magnetic flux leaking to the probe coil 50a. For improving the immunity, it is especially effective to decrease the magnetic reluctance of the magnetic flux path MRC located at the most distant position from the probe coil 50a as much as possible, thereby increasing the magnetic flux passing at the most distant position from the probe coil 50a as much as possible. A more specific measure will be described below.

Figure 5A:
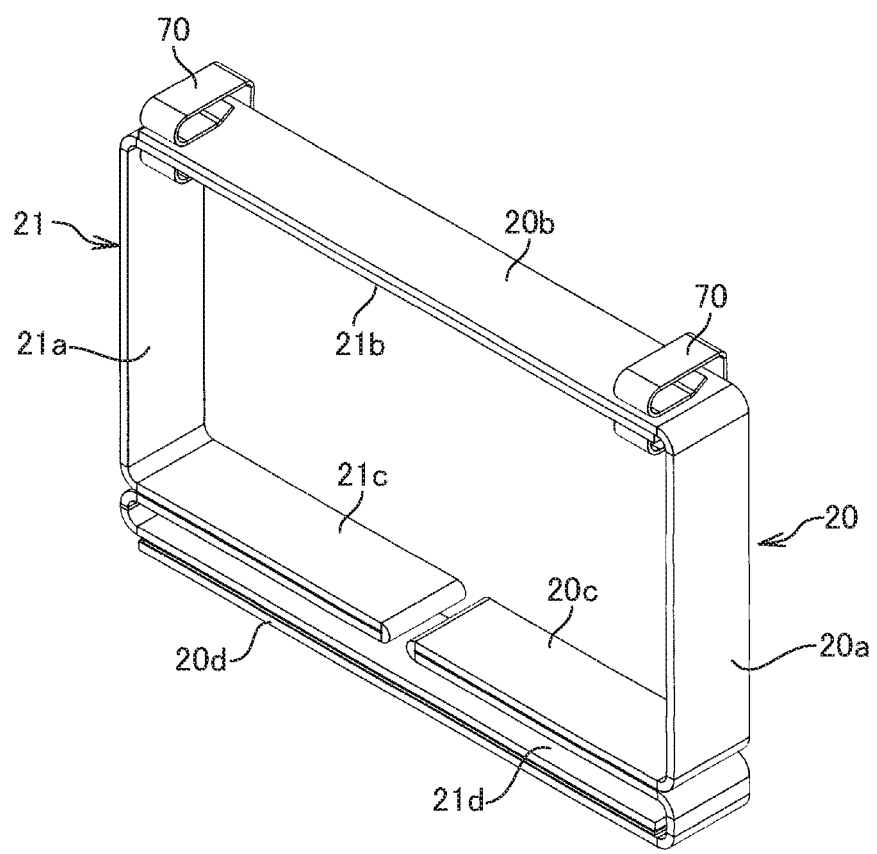
FIGS. 5A and 5B are views to explain a measure for decreasing magnetic reluctance of a magnetic flux path.
Figure 5B:
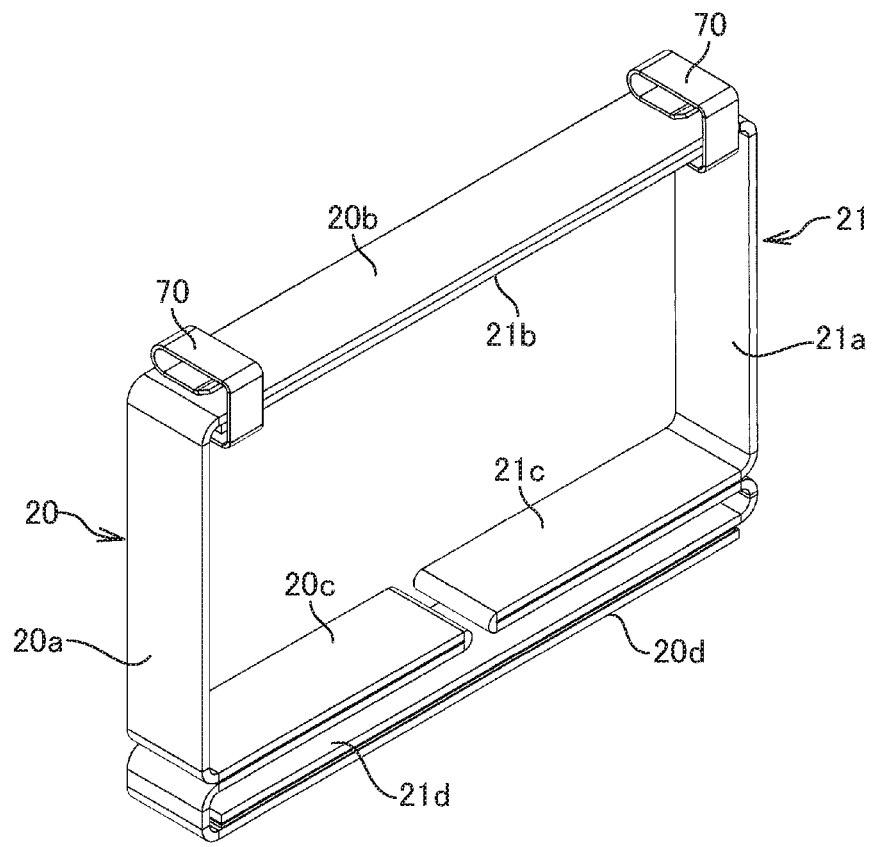

FIGS. 5A and 5B are views to explain a measure for decreasing the magnetic reluctance of the magnetic flux path MRC. FIG. 5A is a perspective view seen from the same direction as that in FIG. 1, and FIG. 5B is a perspective view seen from the opposite direction.

The measure in this embodiment is to press join the long-side portions 20b, 21b forming the magnetic flux path MRC by constantly generated force. For example, the long-side portions 20b, 21b are fixed by clips 70 (metal springs) each made of an elastic material, and the long-side portions 20b, 21b are strongly press-joined in the overlapping direction by repulsive force generated from the clips 70. This decreases the magnetic reluctance of the magnetic flux path MRC, allowing a larger amount of the magnetic flux to pass through the magnetic flux path MRC than in the state where the long-side portions 20b, 21b simply are in contact with or adhere to each other.

Figure 6A:
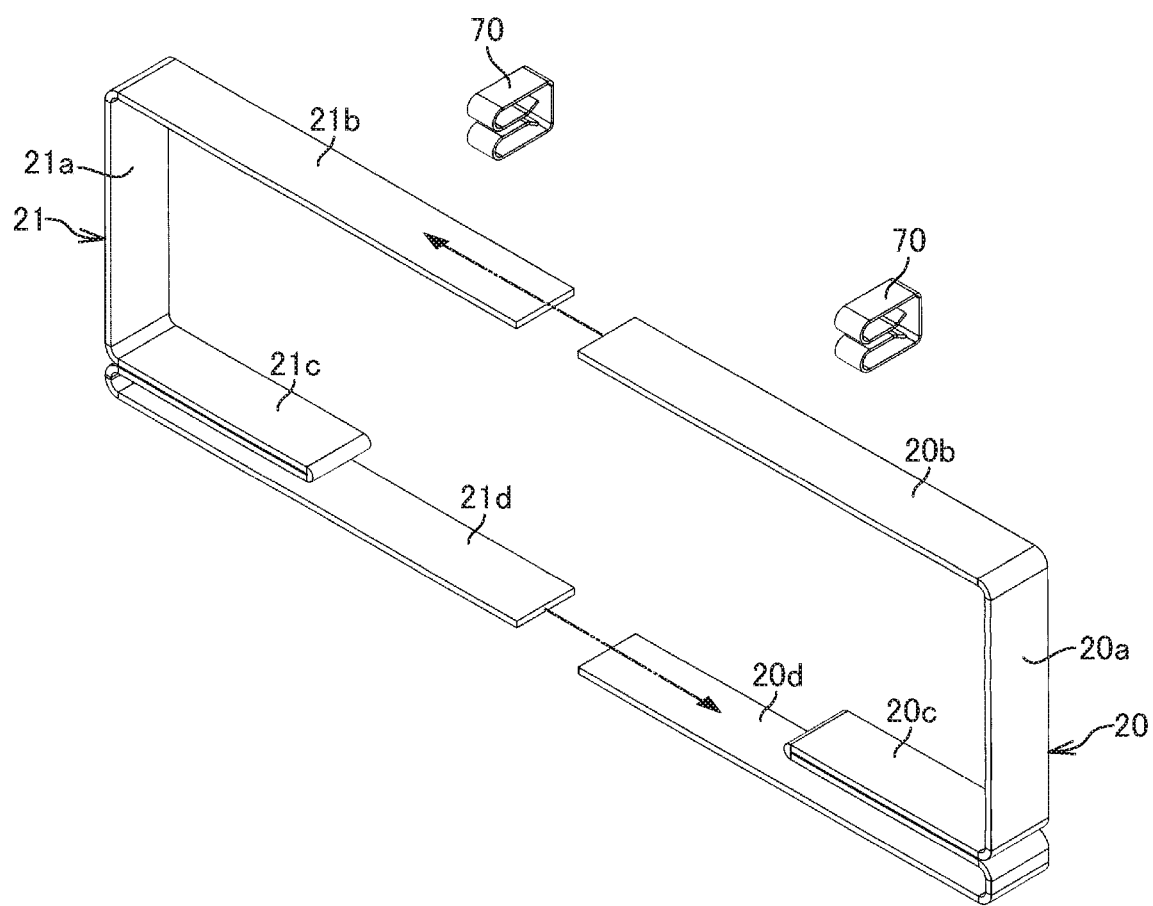
FIG. 6A is an exploded perspective view illustrating how the core components are combined.

FIG. 6A is an exploded perspective view illustrating how the core components 20, 21 are combined.

The core components 20, 21 are combined by being inserted to the aforesaid bobbin units 30, 40 (not illustrated in FIG. 6A) from longitudinal-direction both sides. In FIG. 6A, they are combined, with the long-side portion 20b lying on top of the other long-side portion 21b, and come into contact with each other in the bobbin unit 30. Though these long-side portions 20b, 21b are in contact with or adhere to each other in the bobbin unit 30, this state does not have a factor for positively decreasing the magnetic reluctance. Incidentally, since the gap G1 provided between the outer wall portions 20d, 21d is the structure as is originally designed, a certain degree of variation of the gap G1 (assembly tolerance or the like) is tolerable, and this variation does not cause an extreme increase/decrease in the magnetic reluctance.

Figure 6B:
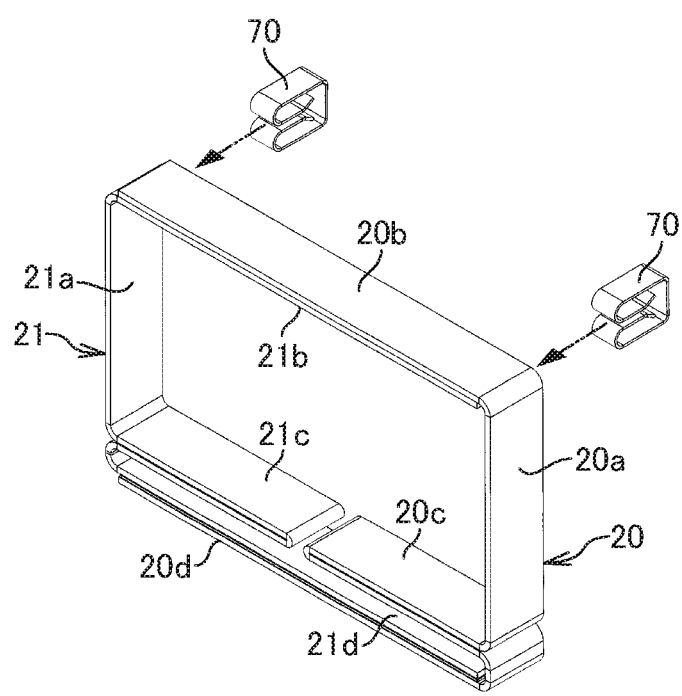
FIG. 6B is an exploded perspective view illustrating how the core components are fixed by clips.

FIG. 6B is an exploded perspective view illustrating how the core components 20, 21 are fixed by the clips 70.

As illustrated in the drawing, the aforesaid clips 70 fix the core components 20, 21 in the combined state, at both end portions of the long-side portions 20b, 21b which are in contact with each other, to give force for press joining the long-side portions 20b, 21b. The press-joining of the long-side portions 20b, 21b makes it possible to strengthen the electric and magnetic joining to make the magnetic reluctance of the magnetic flux path MRC lower than in the state where they are simply in contact with each other. In this embodiment, the clips 70 are disposed at the both end portions of the long-side portions 20b, 21b respectively, and this is because portions protruding to both sides from the bobbin unit 30 are effectively used for the fixing by the clips 70.

Figure 7:
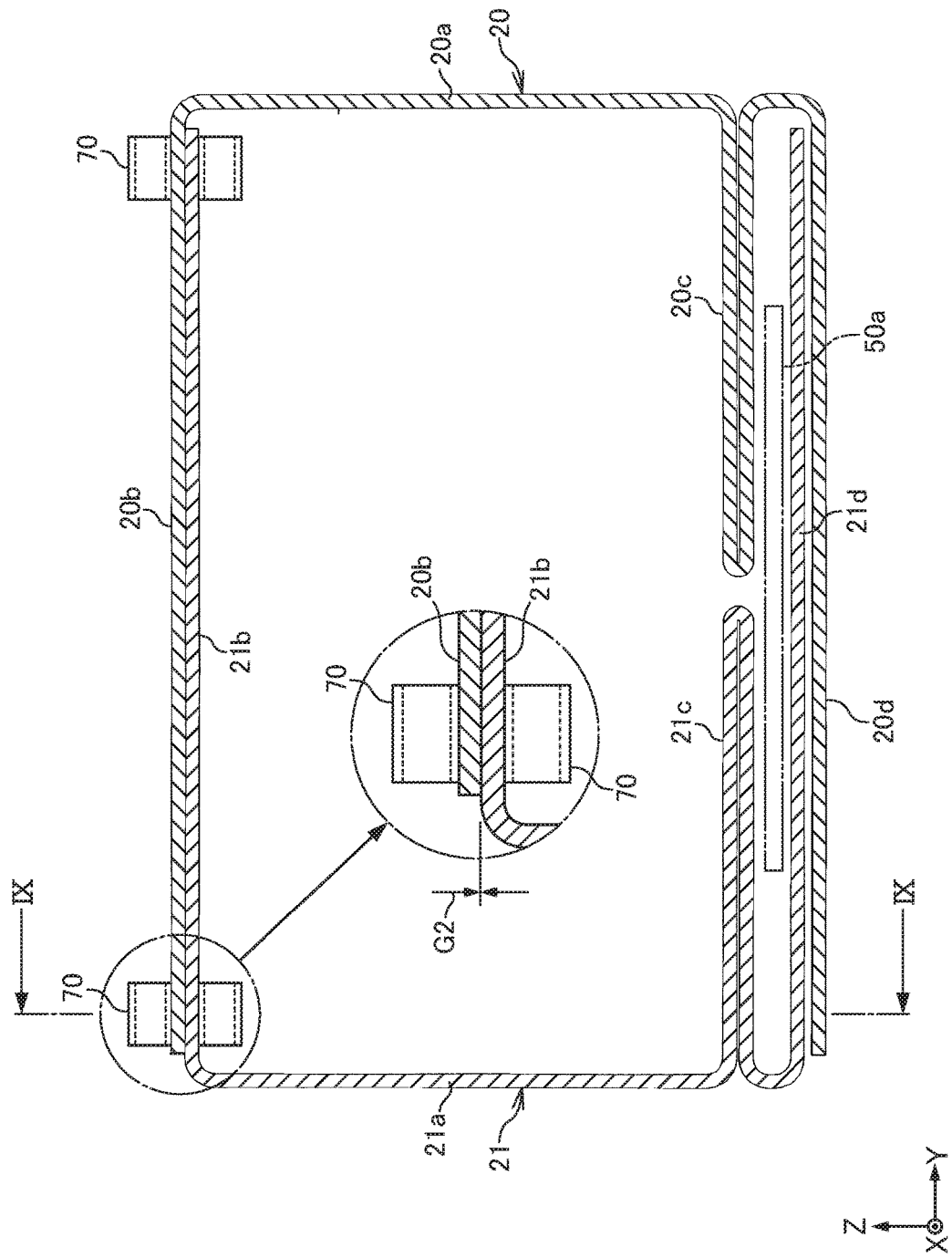
FIG. 7 illustrates a state where long-side portions are press-joined by the clips.

FIG. 7 illustrates the state where the long-side portions 20b, 21b are press joined by the clips 70. As described above, by the clips 70 fixing the core components 20, 21, the long-side portions 20b, 21b are constantly held in the mutually press joined state. In the state where the long-side portions 20b, 21b are press-joined, the gap G2 is kept at the minimum unlike in the state where they simply are in the contact with or adhere to each other. This is because stable force is constantly given from the clips 70 and force different from that given by simple fit into the bobbin unit 30 acts. The press-joining by the clips 70 stabilizes the magnetic reluctance of the magnetic flux path MRC at the minimum level to increase an amount of the magnetic flux passing through the magnetic flux path MRC. This makes the leakage of the magnetic flux to the probe coil 50a unlikely to occur.

The inventors of the present invention conducted a verification regarding the size of the gap G2 by using X-ray images, not illustrated. The verification results have made it clear that, in this embodiment, the gap G2 is constantly kept small, while in a comparative example not adopting the fixing by the clips 70, the gap G2 is large.

Figure 8:
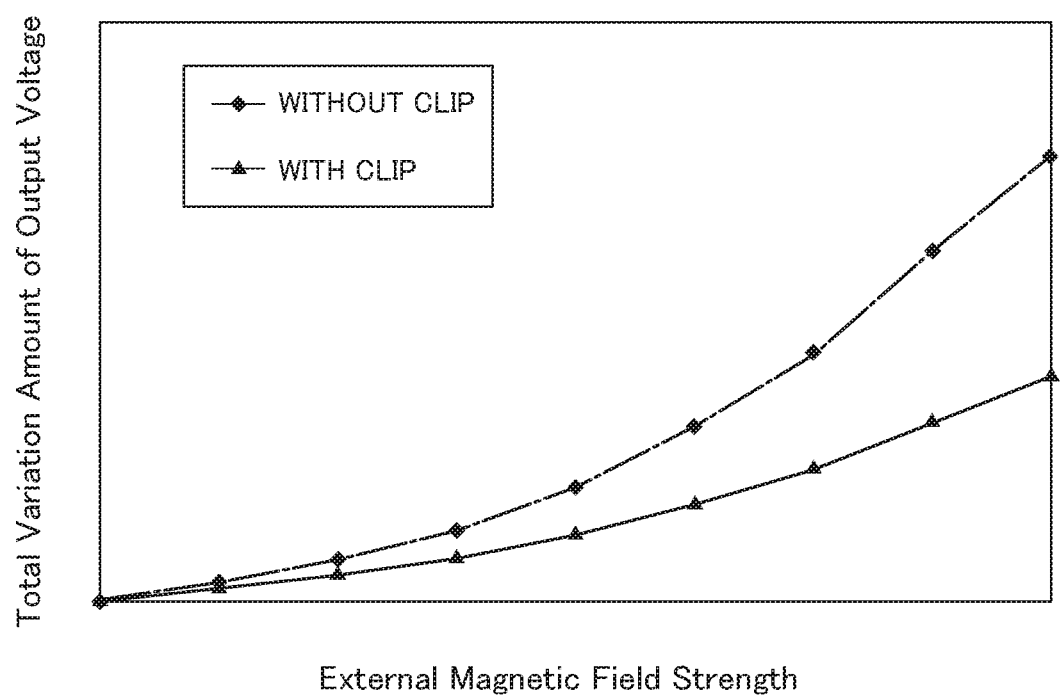
FIG. 8 illustrates verification results regarding an improvement in the immunity to an external magnetic field.

FIG. 8 illustrates the verification results regarding an improvement in the immunity to an external magnetic field. In the verification, the inventors of the present invention placed the current sensor 10 in the X-axis direction, the Y-axis direction, and the Z-axis direction illustrated in FIG. 7 in an external magnetic field environment and measured the output voltages Vout. The graphs illustrated in FIG. 8 represent relations between the total variation amounts (change amounts) (mV) obtained from the following expression and an external magnetic field strength H (A/m).

$$\text{Total variation amount} = \sqrt{(\Delta Vof_x^2 + \Delta Vof_y^2 + \Delta Vof_z^2)}$$

In the above expression, "$\Delta Vof_x$" is an output voltage variation amount when the current sensor 10 is placed in the X-axis direction, and "$\Delta Vof_y$" is an output voltage variation amount when it is placed in the Y-axis direction, and "$\Delta Vof_z$" is an output voltage variation amount when it is placed in the Z-axis direction. Note that load resistance was open, and an ambient temperature was 25° C.

In FIG. 8, the characteristic represented by the alternate long and short dash line (without clip) corresponds to the comparative example, and the characteristic represented by the solid line (with clip) corresponds to this embodiment. As is obvious from the comparison between the both, the variation amount of the output voltage is smaller in this embodiment than in the comparative example. Further, in the comparative example, an increase rate of the variation amount of the output voltage becomes larger as the external magnetic field strength becomes higher, which indicates poor immunity to an external magnetic field. In this embodiment, on the other hand, as the external magnetic field strength becomes higher, the change amount of the output voltage also becomes large, but it is seen that its increase rate is smaller than in the comparative example.

The above verification results have proved that the current sensor 10 of this embodiment is high in the immunity to an external magnetic field.

Figure 9:
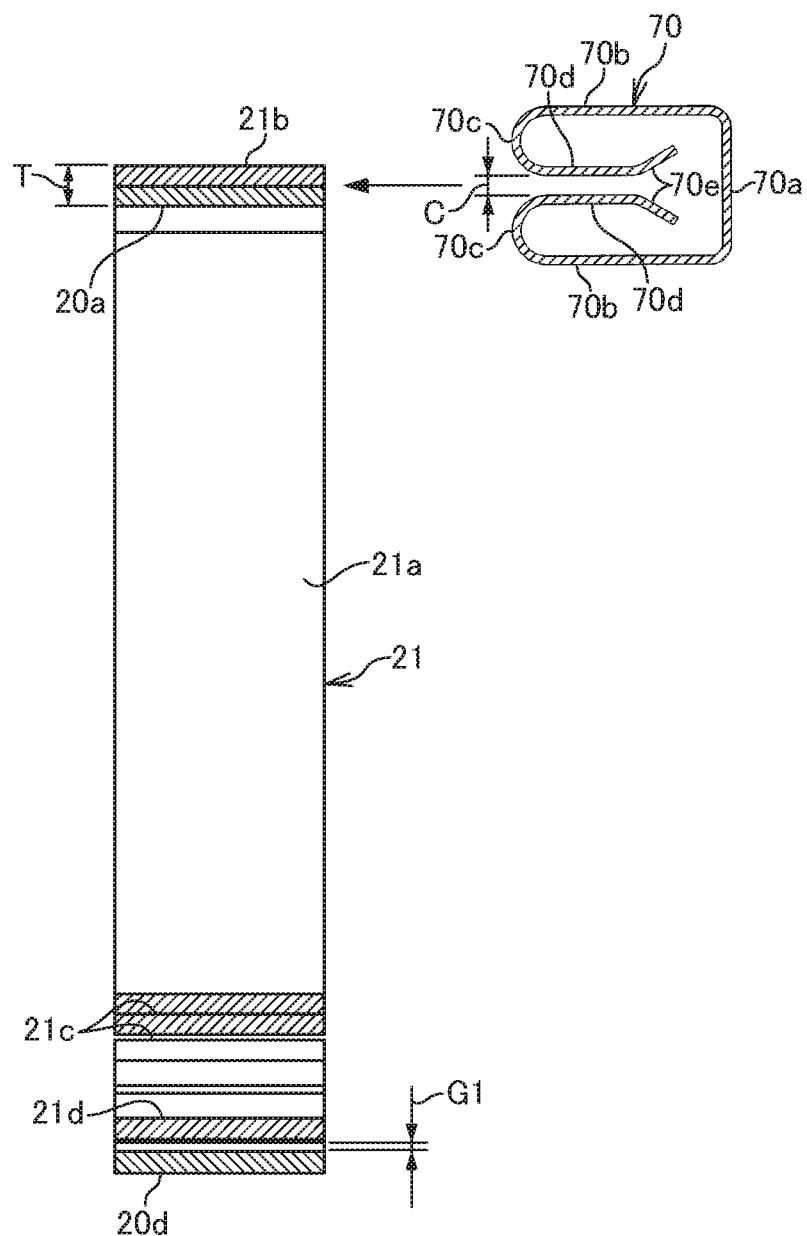
FIG. 9 is a vertical sectional view (sectional view along the cutting line IX-IX in FIG. 7) illustrating the structure of the clip in the current sensor of the first embodiment.

FIG. 9 is a vertical sectional view (sectional view along the cutting line IX-IX in FIG. 7) illustrating the structure of the clip 70 in the current sensor 10 of this embodiment. The clip 70 is formed through bending of a plate-shaped spring material, for instance. As is seen from the sectional shape, the plate-shaped spring material in this embodiment is bent in a U-shape, so that a back portion 70a and outer portions 70b continuing from both ends of the back portion 70a are formed, arc portions 70c continuing from the respective outer portions 70b are formed opposite to the back portion 70a, press-joining plates 70d folded inward from the respective arc portions 70c are formed substantially in parallel to the outer portions 70b, and two tip portions 70e extending from the respective press-joining plates 70d are formed in a shape fanning out in a detaching direction of the clip 70.

In the clip 70 in a free state, an interval C between the pair of press-joining plates 70d is smaller than a thickness T of a stack of the long-side portions 20b, 21b (C<T). When such a clip 70 is attached in the arrow direction, edges of the long-side portions 20b, 21b are guided by the arc portions 70c to push the outer portions 70b and the press joining plates 70d upward and downward, and the back portion 70a elastically deforms to warp. Further, at this time, the whole outer portions 70b undergo deflection deformation from their roots continuing from the back portion 70a, the whole press-joining plates 70d also undergo deflection deformation from their roots continuing from the arc portions 70c, and the arc portions 70c can also undergo inward deflection deformation. When the long-side portions 20b, 21b are sandwiched and fixed by the clip 70 while the aforesaid portions of the clip 70 undergo the elastic deformation in this manner, the clip 70 constantly generates the force firmly press joining the long-side portions 20b, 21b due to energy stored in these portions. Consequently, it is possible to decrease the magnetic reluctance in the aforesaid magnetic flux path MRC to improve the immunity of the current sensor 10 to an external magnetic field.

It should be noted that the specific shape of the clip 70 is not limited to the illustrated example, and may be any other suitable shape. Further, places where to set the clips 70 are not limited to two places, that is, the both end portions of the long-side portions 20b, 21b. The clip 70 may be disposed at another position, and the number of the clips 70 may be also increased/decreased.

Figure 10:
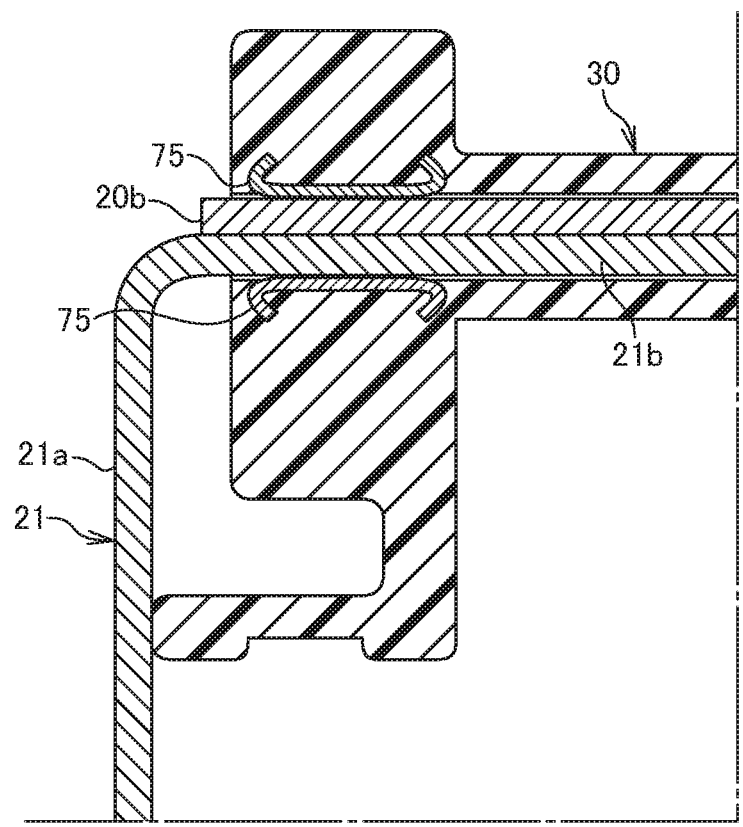
FIG. 10 is an enlarged sectional view illustrating a corner portion of core components in a current sensor of the second embodiment.

Next, a current sensor of the second embodiment will be described. FIG. 10 illustrates an enlarged section of a corner portion of core components 20, 21 in the current sensor of the second embodiment, with a bobbin unit 30 included in the drawing.

The second embodiment is different from the above-described first embodiment in that a clip 75 is integrally formed in the bobbin unit 30. The clip 75 is a leaf spring-shaped member having an arc-shaped cross section, for instance, and is molded (insert-molded) integrally with the bobbin unit 30, with its press-joining plates (no reference sign) in an arc shape exposed from an inner surface of the bobbin unit 30.

According to such an embodiment, in a state where the core components 20, 21 are fitted in the bobbin unit 30, long-side portions 20b, 21b are in contact with each other and are strongly press joined by force generated by the clip 75. It should be noted that the shape of the clip 75 is not limited to the example illustrated in FIG. 10, but may be another shape. Further, a position where the clip 75 is insert-molded may be near the longitudinal-direction center of the bobbin unit 30, and the number of the clips 75 is also any.

Figure 11:
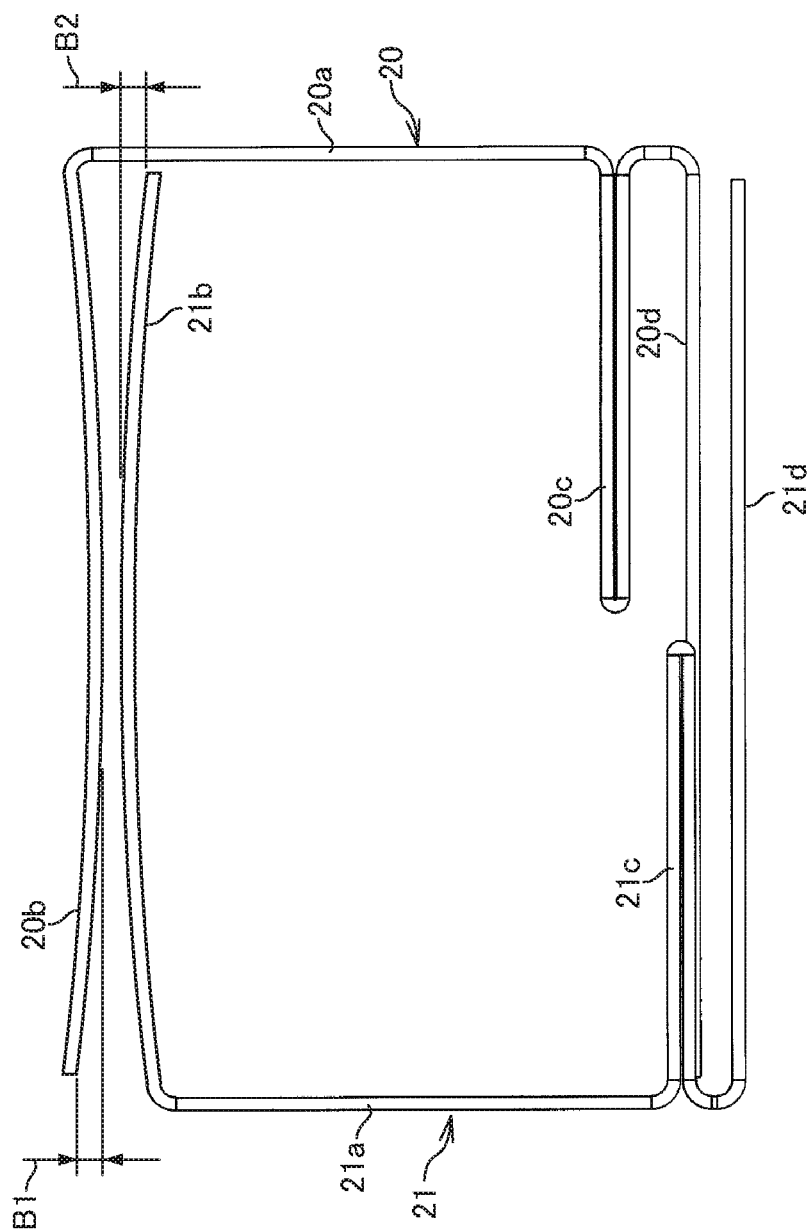
FIG. 11 illustrates core components in a current sensor of the third embodiment.

Next, a current sensor of the third embodiment will be described. FIG. 11 illustrates core components 20, 21 in the current sensor of the third embodiment. As described above, in the first and second embodiments, the long-side portions 20b, 21b of the core components 20, 21 are formed in the flat shape. The third embodiment is different from the above-described first and second embodiments in that long-side portions 20b, 21b are formed in a curved shape in advance.

Specifically, the long-side portions 20b, 21b are curved so as to bulge toward each other. Accordingly, the long-side portions 20b, 21b respectively have offsets B1, B2 between tip edges and center portions of their contact surfaces. These offsets B1, B2 decrease when the core components 20, 21 are fitted in the bobbin unit 30, and at this time, the long-side portions 20b, 21b generate force by energy stored as a result of own deformation accompanying the fitting and are capable of being press joined with each other in the bobbin unit 30. Incidentally, the core components 20, 21 illustrated in FIG. 11 may be used together with the clip 70 in the first embodiment or may be used together with the clip 75 in the second embodiment.

In the above-described embodiments, the long-side portions 20b, 21b of the core components 20, 21 are partial portions in contact with each other, but the outer wall portions 20d, 21d may be partial portions in contact with each other. In this case, the core components 20, 21 in FIG. 3A and so on are formed, with the outer wall portions 20d, 21d overlapping with each other without any gap therebetween, and by disposing the clips 70 at both end portions (two places) of the long-side portions 20b, 21b protruding to both sides of the bobbin unit 40, it is possible to press-join the long-side portions 20b, 21b with each other. Alternative structures may be that the clip 75 insert-molded in the bobbin unit 40 press-joins the outer wall portions 20d, 21d, and that the outer wall portions 20d, 21d curved in a bulging shape are press joined with each other. Further, the position where the core components 20, 21 are in contact and press-joined with each other can be at least either the long-side portions 20b, 21b or the outer wall portions 20d, 21d. At this time, one or a combination of two or more of the press joining by the clip 70, the press joining by the insert-type clip 75, the press joining by the bulging shape of the long-side portions 20b, 21b, and the press joining by the bulging shape of the outer wall portions 20d, 21d can be employed.

As described hitherto, the current sensors of the first, second, and third embodiments have the following advantages.

(1) The embodiments constantly achieve a stable decrease in the magnetic reluctance of a certain portion located at a position distant from the probe coil 50a (field probe) in the magnetic circuit formed in the state where the core components 20, 21 are combined.

(2) The embodiments surely achieve the above effect in (1) by including, in addition to the means for simply achieving the contact or the adhesion, the means for generating the force positively press joining the two core components 20, 21.

(3) If the core components 20, 21 are merely interference-fitted (press-fitted) in the bobbin unit 30, a contact (adhesion) degree of the core components 20, 21 deteriorates with the lapse of time. On the other hand, the embodiments are capable of exhibiting the above effect in (1) for a long period without influenced by the aged deterioration.

(4) In particular, the clip 70 in the first embodiment is replaceable when required even during the use of the current sensor 10, which facilitates maintenance management of the immunity improvement.

The present invention is not limited to the above-described embodiments and may be implemented in various modified forms. For example, in the embodiments, the core components 20, 21 have such a shape as to form a rectangular magnetic circuit, but may have such a shape as to form a magnetic circuit having another shape.

Further, the current sensor 10 may be applied not only to the flux-gate type current sensor but also to a magnetic balance type current sensor using a Hall element.

Besides, the structures described with reference to the drawings in the embodiments are only preferred examples, and it goes without saying that the present invention can be suitably implemented even if various elements are added to the basic structure or part thereof is replaced.

What is claimed is:

1. A current sensor, comprising:
a magnetic circuit that is to be formed around a primary conductor in which a primary current being a sensing target flows;
a probe coil disposed on the magnetic circuit;
a secondary winding that generates, in the magnetic circuit, a magnetic field in a direction opposite to a direction of a magnetic field generated by the flow of the primary current;
a sensing circuit that outputs a sensing signal according to the primary current based on a secondary current of the secondary winding as required to eliminate a current output from the probe coil;
a plurality of core components that have magnetism, and in a combined state, form the magnetic circuit by partial portions of the core components being in physical contact with each other, the core components having other portions that form an air gap where to dispose the probe coil on the magnetic circuit and are in non-physical contact with each other; and
a metal clip that sandwiches the plurality of core components at a predetermined same position of the partial portions where the core components are in physical contact with each other and are press-joined in an overlapping direction by repulsive force generated by the metal clip.

2. The current sensor according to claim 1,
wherein the plurality of core components include plate-shaped portions overlapping with each other in the combined state, and
wherein the metal clip applies external force tightly sandwiching the plate-shaped portions in an overlapping direction to achieve the press joining.

3. The current sensor according to claim 2, further comprising:
a bobbin in which the plurality of core components in the combined state are housed and on whose outer side the secondary winding is held,
wherein the metal clip is formed integrally with the bobbin, thereby generating the press-joining force when the plurality of core components are housed.

4. The current sensor according to claim 3,
wherein the plurality of core components include plate-shaped portions, respectively, the plate-shaped portions in a separate state have a shape bulging in the overlapping direction, and in the combined state, overlap with each other, and the plate-shaped portions in the combined state deform substantially flat to overlap with each other and be press-joined with each other by receiving the force from the metal clip.

5. The current sensor according to claim 2,
wherein the plurality of core components include plate-shaped portions, respectively, the plate-shaped portions in a separate state have a shape bulging in the overlapping direction, and in the combined state, overlap with each other, and the plate-shaped portions in the combined state deform substantially flat to overlap with each other and be press-joined with each other by receiving the force from the metal clip.

6. The current sensor according to claim 1, further comprising:
a bobbin in which the plurality of core components in the combined state are housed and on whose outer side the secondary winding is held,
wherein the metal clip is formed integrally with the bobbin, thereby generating the press-joining force when the plurality of core components are housed.

7. The current sensor according to claim 6,
wherein the plurality of core components include plate-shaped portions, respectively, the plate-shaped portions in a separate state have a shape bulging in the overlapping direction, and in the combined state, overlap with each other, and the plate-shaped portions in the combined state deform substantially flat to overlap with each other and be press-joined with each other by receiving the force from the metal clip.

8. The current sensor according to claim 1,
wherein the plurality of core components include plate-shaped portions, respectively, the plate-shaped portions in a separate state have a shape bulging in the overlapping direction, and in the combined state, overlap with each other, and the plate-shaped portions in the combined state deform substantially flat to overlap with each other and be press-joined with each other by receiving the force from the metal clip.

9. A current sensor, comprising:
a magnetic circuit that is to be formed around a primary conductor in which a primary current being a sensing target flows;
a probe coil disposed on the magnetic circuit;
a secondary winding that generates, in the magnetic circuit, a magnetic field in a direction opposite to a direction of a magnetic field generated by the flow of the primary current;
a bobbin on whose outer side the secondary winding is held;
a sensing circuit that outputs a sensing signal according to the primary current based on a secondary current of the secondary winding as required to eliminate a current output from the probe coil;
a plurality of core components that have magnetism and include plate-shaped portions which, in a separate state, have shapes symmetrically curving in an overlapping direction, that form the magnetic circuit by the plate-shaped portions deforming substantially flat to overlap with each other and be press-joined with each other when housed in the combined state in the bobbin member, the core components having portions, other than the plate-shaped portions, that form an air gap where to dispose the probe coil on the magnetic circuit and are in non-physical contact with each other.

10. The current sensor according to claim 9, further comprising:
a clip that generates force press-joining the plurality of core components with each other at the plate-shaped portions.

11. The current sensor according to claim 10,
wherein the clip applies external force tightly sandwiching the plate-shaped portions in an overlapping direction to achieve the press joining.

12. The current sensor according to claim 11,
wherein the clip is formed integrally with the bobbin, thereby generating the press-joining force when the plurality of core components are housed.

13. The current sensor according to claim 10,
wherein the clip is formed integrally with the bobbin, thereby generating the press-joining force when the plurality of core components are housed.

* * * * *